(12) United States Patent
Sung et al.

(10) Patent No.: US 11,145,759 B2
(45) Date of Patent: Oct. 12, 2021

(54) SILICON GERMANIUM P-CHANNEL FINFET STRESSOR STRUCTURE AND METHOD OF MAKING SAME

(71) Applicant: Taiwan Semiconductor Manufacturing Co., Ltd., Hsinchu (TW)

(72) Inventors: Hsueh-Chang Sung, Zhubei (TW); Liang-Yi Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 34 days.

(21) Appl. No.: 15/782,637

(22) Filed: Oct. 12, 2017

(65) Prior Publication Data

US 2018/0033882 A1 Feb. 1, 2018

Related U.S. Application Data (62) Division of application No. 14/954,299, filed on Nov. 30, 2015, now Pat. No. 9,793,404.

(51) Int. Cl.
| | |
|---|---|
| *H01L 29/78* | (2006.01) |
| *H01L 29/66* | (2006.01) |
| *H01L 29/165* | (2006.01) |
| *H01L 29/06* | (2006.01) |
| *H01L 21/02* | (2006.01) |
| *H01L 21/306* | (2006.01) |

(52) U.S. Cl.
CPC ...... *H01L 29/785* (2013.01); *H01L 21/02532* (2013.01); *H01L 21/30604* (2013.01); *H01L 29/6656* (2013.01); *H01L 29/66795* (2013.01); *H01L 29/7848* (2013.01)

(58) Field of Classification Search
CPC ............. H01L 29/41791; H01L 29/7848
See application file for complete search history.

(56) References Cited

U.S. PATENT DOCUMENTS

| | | | |
|---|---|---|---|
| 2014/0001520 A1 | 1/2014 | Glass et al. | |
| 2014/0252489 A1* | 9/2014 | Yu | H01L 29/66795 257/368 |
| 2015/0170916 A1* | 6/2015 | Yu | H01L 21/02532 438/493 |
| 2015/0333145 A1* | 11/2015 | Chudzik | H01L 29/66795 257/401 |
| 2016/0027918 A1* | 1/2016 | Kim | H01L 29/165 257/401 |
| 2016/0268257 A1* | 9/2016 | Lim | H01L 27/0886 |
| 2016/0293717 A1* | 10/2016 | Kim | H01L 29/41791 |

\* cited by examiner

*Primary Examiner* — Omar F Mojaddedi
(74) *Attorney, Agent, or Firm* — Sterne, Kessler, Goldstein & Fox P.L.L.C.

(57) ABSTRACT

A source/drain (S/D) structure includes a SiGe structure epitaxially grown and having sloped facets on a recessed fin structure disposed adjacent to a channel portion of a finFET, a first Ge structure having a rounded surface epitaxially grown on the SiGe structure, and a capping layer formed over the rounded surface of the Ge structure. The capping layer may be formed of Si. Such S/D structures provide both a larger physical size for lower contact resistance, and greater volume and concentration of Ge for higher compressive strain applied to the channel portion of the finFET.

20 Claims, 8 Drawing Sheets

FIG. 8

SILICON GERMANIUM P-CHANNEL FINFET STRESSOR STRUCTURE AND METHOD OF MAKING SAME

CROSS-REFERENCE TO RELATED APPLICATIONS

This application is a divisional of U.S. application Ser. No. 14/954,299, filed Nov. 30, 2015 (now U.S. Pat. No. 9,793,404), the disclosure of which is incorporated by reference herein in its entirety.

BACKGROUND

Many developments in both semiconductor structures and manufacturing processes have contributed to reducing the size and increasing the performance of integrated circuits. One recent advance in semiconductor structures has been the introduction of a transistor structure referred to as a finFET. Those skilled in the art will recognize that the electrical performance of a finFET is affected by many factors, including the quality of the contacts made to the source and drain regions on either side of the fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The acronym "FET," as used herein, refers to a field effect transistor. A very common type of FET is referred to as a metal oxide semiconductor field effect transistor (MOSFET). Historically, MOSFETs have been planar structures built in and on the planar surface of a substrate such as a semiconductor wafer. But recent advances in semiconductor manufacturing have resulted in the use vertical structures.

The term "finFET" refers to a FET that is formed over a fin that is vertically oriented with respect to the planar surface of a wafer.

S/D refers to the source and/or drain junctions that form two of the four terminals of a FET.

The expression "epitaxial layer" herein refers to a layer or structure of single crystal semiconductor material. Likewise, the expression "epitaxially grown" herein refers to a layer or structure of single crystal semiconductor material.

The expression "high-k" refers to a high dielectric constant. For example, high-k refers to a dielectric constant that is greater than the dielectric constant of $SiO_2$ (i.e., greater than 3.9).

The term "vertical," as used herein, means nominally perpendicular to the surface of a substrate.

Overview

Various embodiments in accordance with this disclosure provide p-channel finFET S/D stressors of greater volume and higher germanium concentration than conventional finFET processes and structures. Having a greater volume at the S/D regions may provide for lower contact resistance. Having a higher germanium concentration may provide for a greater compressive stress in the p-channel of the finFET which in turn provides for a higher hole mobility for improved transistor performance.

Electron mobility in n-channel FETs may be increased by applying tensile stress to the channel portion of such n-channel FETs. Similarly, hole mobility in p-channel FETs may be increased by applying compressive stress to the channel portion of such p-channel FETs.

Figure 1A:
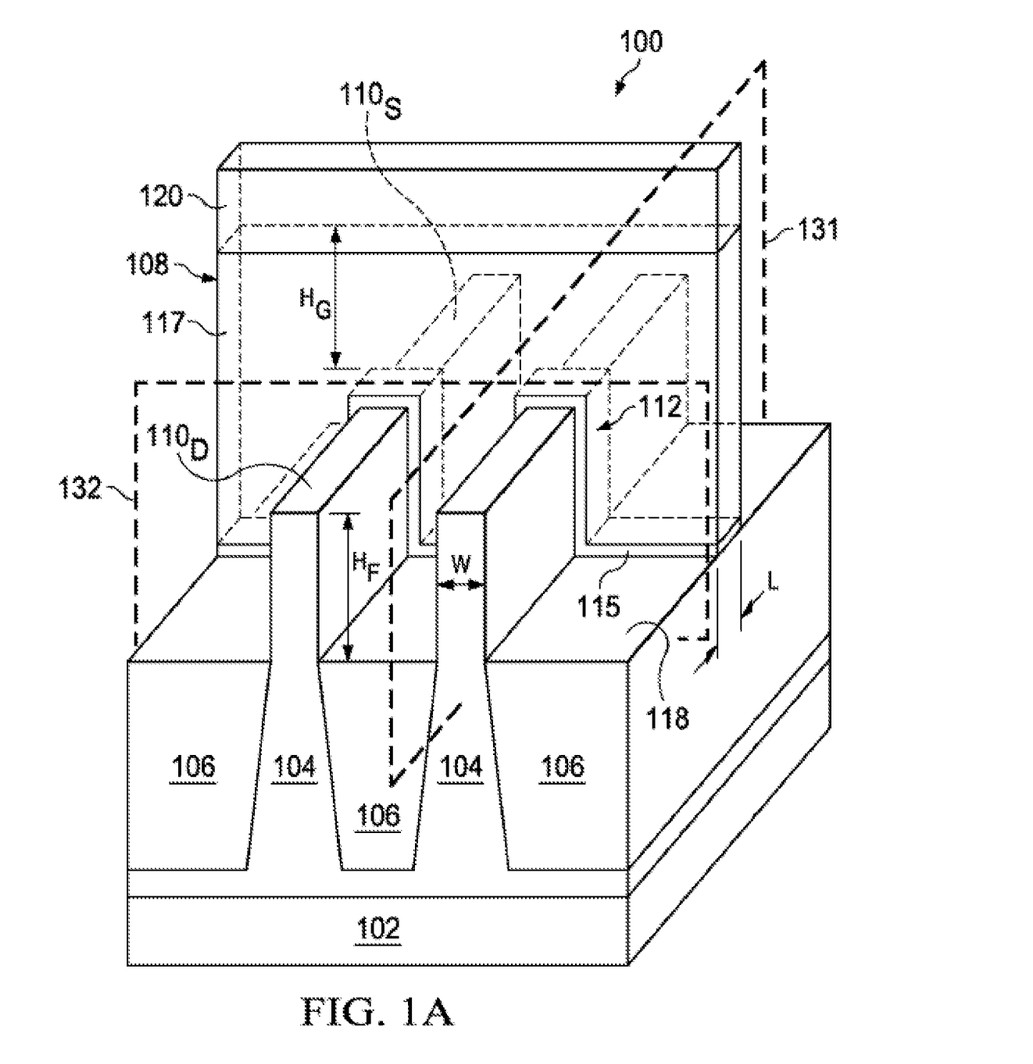
FIG. 1A is a perspective view of an example semiconductor device structure, in accordance with some embodiments.
Figure 1B:
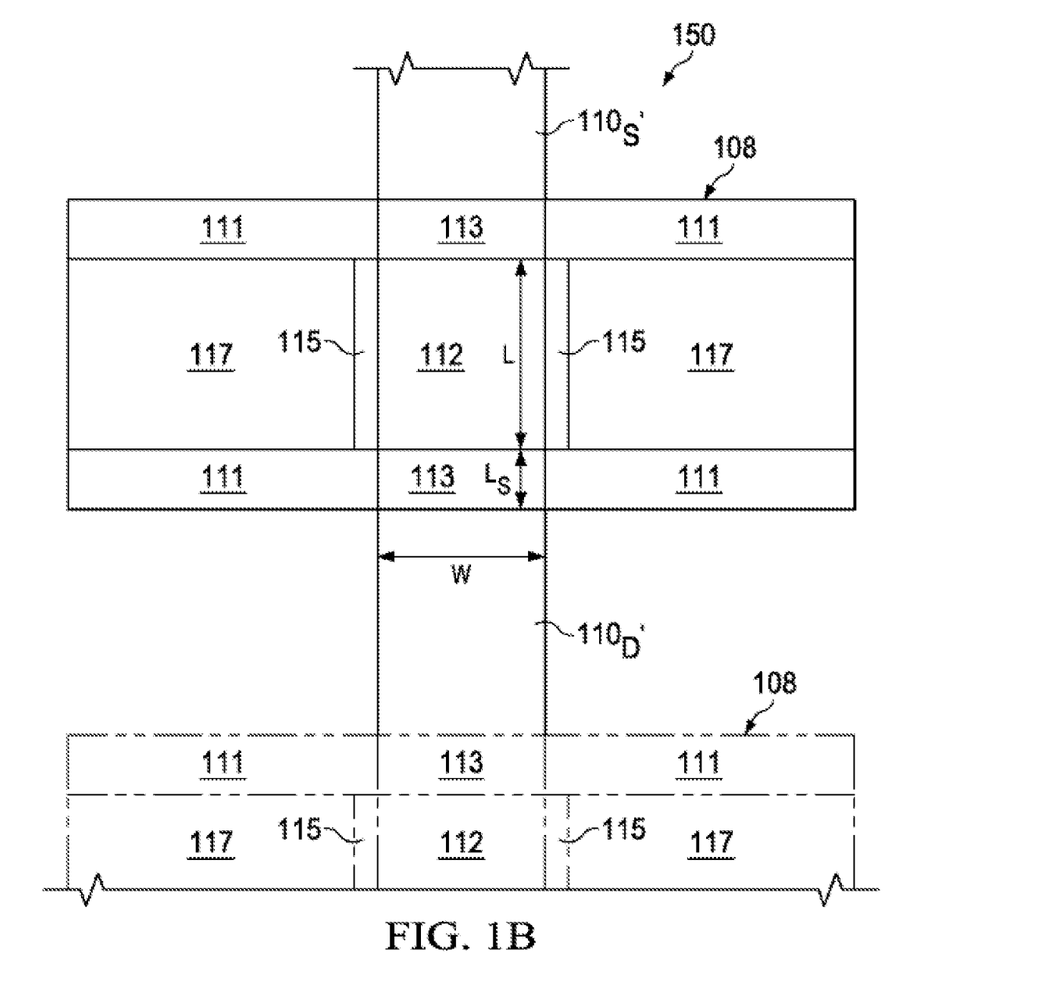
FIG. 1B shows a top view of an example transistor region, in accordance with some embodiments.
Figure 2A:
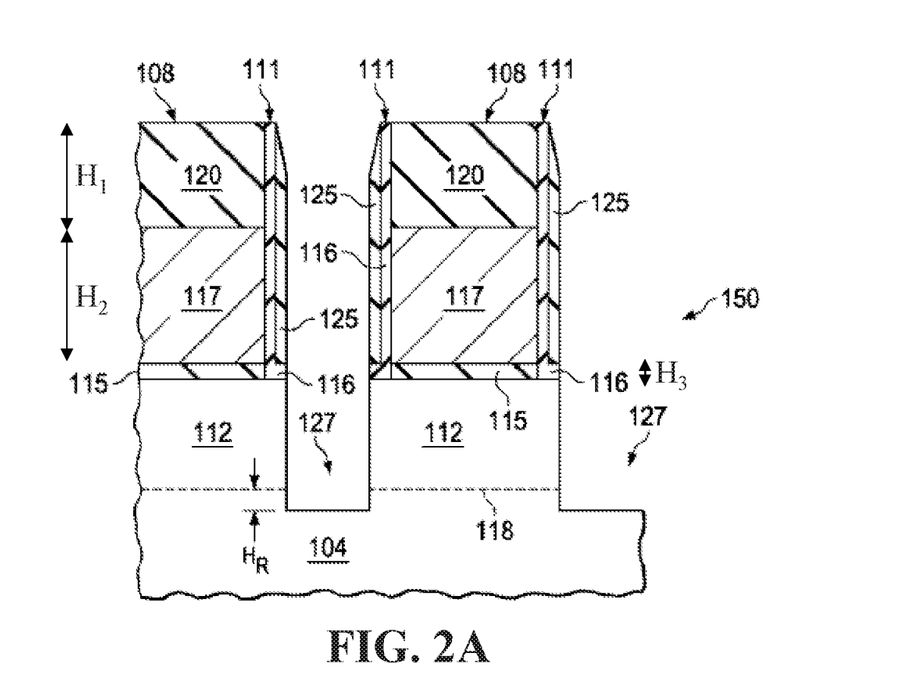
FIGS. 2A and 2B show cross-sectional views of an example transistor region, in accordance with some embodiments.
Figure 2B:
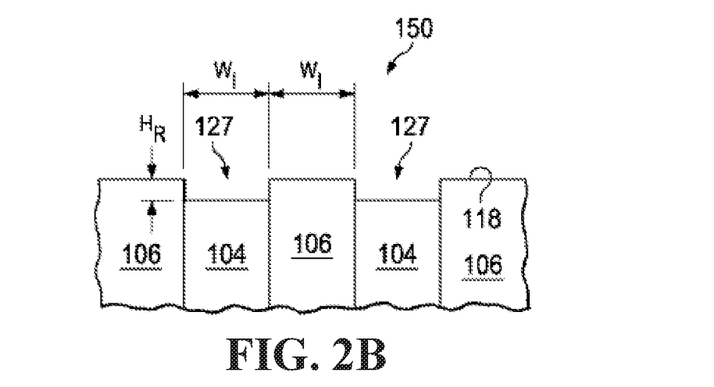
Figure 3A:
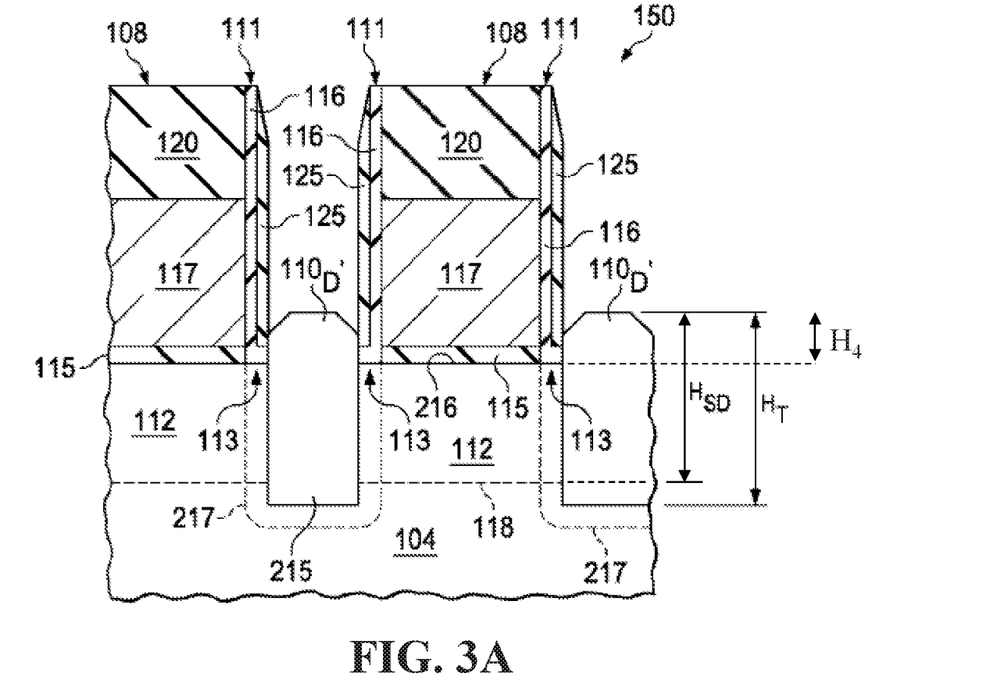
FIGS. 3A and 3B show cross-sectional views of an example transistor region after forming the doped source and drain regions, in accordance with some embodiments.
Figure 3B:
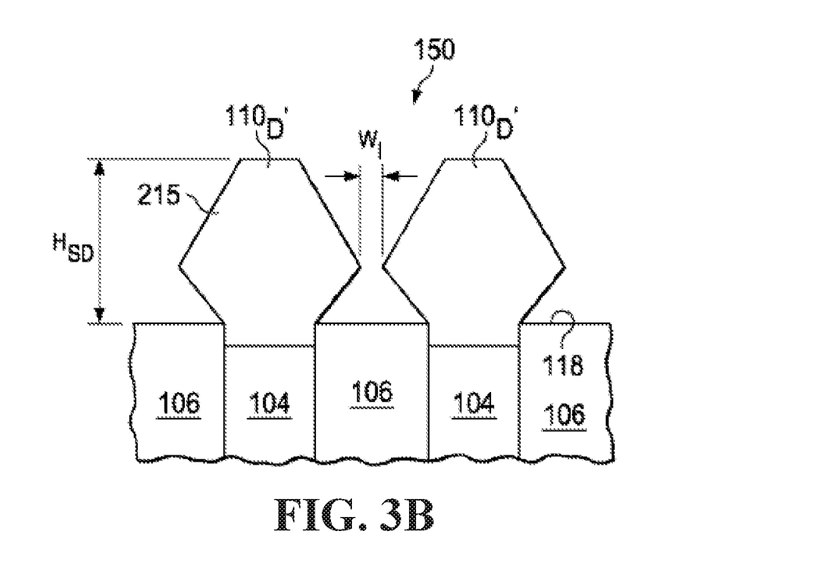

Before describing the embodiments related to the design of the S/D regions of a finFET, an example fabrication process for a finFET is presented. FIGS. 1-3 provide various views of a semiconductor device that includes finFETs during various stages of fabrication. The fabrication process provided here is exemplary, and many other steps may be performed that are not shown in these figures.

Illustrated in FIG. 1A is perspective view of a semiconductor device structure 100, in accordance with some embodiments. The semiconductor device structure 100 includes finFET device structures. The semiconductor device structure 100 includes a substrate 102, a plurality of fins 104, a plurality of isolation structures 106, and a gate structure 108 disposed on each of the fins 104. The gate structure 108 may include a gate dielectric layer 115, a gate electrode layer 117, and/or one or more additional layers. A mask layer 120 is over the gate electrode layer 117. The hard mask layer 120 is used to pattern, such as by etching, the gate structure 108. In some embodiments, the hard mask layer 120 is made of a dielectric material, such as silicon oxide. The perspective view of FIG. 1A is taken after the patterning (or forming) process of gate structure 108. FIG. 1A shows only one gate structure 108. There are additional gate structure(s) (not shown) similar and parallel to the gate structure 108 shown in FIG. 1A.

Each of the plurality of fins 104 include a source region $110_S$ and a drain region $110_D$, where source or drain features are formed in, on, and/or surrounding the fin 104. A channel region 112 of the fin 104 underlies the gate structure 108. The channel region 112 of fin 104 has a length (gate length) L, and a width (gate width) W, as shown in FIG. 1A. In some embodiments, the length (gate length) L is in a range from about 10 nm to about 30 nm. In some other embodiments, the gate length L is in a range from about 3 nm to about 10 nm. In some embodiments, the width (gate width) W is in a range from about 10 nm to about 20 nm. In some other embodiments, the width (gate width) W is in a range from about 3 nm to about 10 nm. The height (gate height) $H_G$ of gate structure 108, measured from the top of fin 104 to the top of gate structure 108, is in a range from about 50 nm to about 80 nm, in some embodiments. The height (fin height) $H_F$ of fin 104, measured from the surface of isolation structure 106 to the top of fin 104, is in a range from about 35 nm to about 60 nm, in some embodiments.

The substrate 102 may be a silicon substrate. Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In an embodiment, the substrate 102 is a semiconductor on insulator (SOI).

The isolation structures 106 is made of a dielectric material and may be formed of silicon oxide, silicon nitride, silicon oxynitride, fluoride-doped silicate glass (FSG), a low-k dielectric material, and/or other suitable insulating material. The isolation structures 106 may be shallow trench isolation (STI) features. In an embodiment, the isolation structures are STI features and are formed by etching trenches in the substrate 102. The trenches may then be filled with isolating material, followed by a chemical mechanical polish (CMP). Other fabrication techniques for the isolation structures 106 and/or the fin structure 104 are possible. The isolation structures 106 may include a multi-layer structure, for example, having one or more liner layers.

The fin structures 104 may provide an active region where one or more devices are formed. In an embodiment, a channel region (112) of a transistor device is formed in the fin 104. The fin 104 may comprise silicon or another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The fins 104 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. The masking element may then be used to protect regions of the substrate while an etch process forms a recesses into isolation structures 106, leaving protruding fins. The recesses may be etched using reactive ion etch (ME) and/or other suitable processes. Numerous other embodiments of methods to form the fins 104 on the substrate 102 may be suitable.

The gate structure 108 may include a gate dielectric layer 115, a gate electrode layer 117, and/or one or more additional layers. In an embodiment, the gate structure 108 is a sacrificial gate structure such as formed in a replacement gate process used to form a metal gate structure. In an embodiment, the gate structure 108 includes polysilicon layer (as the gate electrode layer 117).

In an embodiment, the gate structure 108 may be a metal gate structure. The metal gate structure may include interfacial layer(s), gate dielectric layer(s), work function layer(s), fill metal layer(s) and/or other suitable materials for a metal gate structure. In other embodiments, the metal gate structure 108 may further include capping layers, etch stop layers, and/or other suitable materials. The interfacial layer may include a dielectric material such as silicon oxide layer (SiO2) or silicon oxynitride (SiON). The interfacial dielectric layer may be formed by chemical oxidation, thermal oxidation, atomic layer deposition (ALD), chemical vapor deposition (CVD), and/or other suitable formation process.

Exemplary p-type work function metals that may be included in the gate structure 108 include TiN, TaN, Ru, Mo, Al, WN, ZrSi2, MoSi2, TaSi2, NiSi2, WN, other suitable p-type work function materials, or combinations thereof. Exemplary n-type work function metals that may be included in the gate structure 108 include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the first work function layer is chosen to tune its work function value so that a desired threshold voltage Vt is achieved in the device that is to be formed in the respective region. The work function layer(s) may be deposited by CVD, physical vapor deposition (PVD), and/or other suitable process. The fill metal layer may include Al, W, or Cu and/or other suitable materials. The fill metal may be formed by CVD, PVD, plating, and/or other suitable processes. The fill metal may be deposited over the work function metal layer(s), and thereby filling in the remaining portion of the trenches or openings formed by the removal of the dummy gate structure.

The semiconductor device structure 100 described above include fins 104 and gate structure 108. The semiconductor device structure 100 needs additional processing to form various features, such as lightly-doped-drain (LDD) regions and doped source/drain structures, of the transistor utilizing structure 100. LDD regions are next to channel regions and are under spacers. The term LDD regions are used to describe lightly doped regions next to both source and drain regions.

FIG. 1B shows a top view of a transistor region 150 formed with one of the fins 104 of FIG. 1A and taken on a surface leveled with the top surface 118 of isolation structure 106, in accordance with some embodiments. Transistor region 150 includes a doped source region $110_S'$ and a doped drain region $110_D'$, which have the same cross-sections as doped source regions $110_S$ and doped drain region $110_D$, respectively, of FIG. 1A at surface 118.

Transistor region 150 also includes a channel region 112, which is part of fin 104 and is surrounded by gate structure 108 on three sides, as shown in FIG. 1A. The channel region 112 has a length (gate length) L and a width (gate width) W. Transistor region 150 also includes gate dielectric layer 115 and gate electrode layer 117. FIG. 1B shows LDD regions 113 between source region $110_S$ and channel region 112, and between drain region $110_D$ and channel region 112. LDD regions 113 have a width W and a length $L_S$, which is defined by the width of spacers 111. FIG. 1B shows another gate structure 108 by dotted lines. This other gate structure 108 has been described above as being similar and parallel to the gate structure 108 and is not shown in FIG. 1A. In some embodiments, $L_S$ is in a range from about 5 nm to about 10 nm.

FIGS. 2A and 2B show cross-sectional views of transistor region 150 after recesses 127 are formed, in accordance with some embodiments. Prior to recessing the source and drain regions of p-channel devices, a photolithography process could be used to cover other regions, such as n-channel device regions, on substrate 102, with photoresist to prevent etching. As a result, a resist removal process is needed after the etching process and before the next operation. Additional cleaning process could be used to ensure no residual resist remains on the substrate.

FIG. 2A shows two neighboring gate structures 108 according to the cut 131 illustrated in FIG. 1A, in accordance with some embodiments. As mentioned above, there are additional gate structure(s) similar and parallel to the gate structure 108 shown in FIG. 1A. FIG. 2A shows two neighboring gate structures 108 are formed over fin 104 and are separated by recesses 127, which are formed by etching source/drain regions $110_D$ and $110_S$ of FIG. 1A. For simplicity of discussion, we designate recesses 127 as recessed drain region ($110_D$). Each gate structure 108 includes a gate electrode layer 117 and a gate dielectric layer 115. A hard mask layer 120 is formed over the gate electrode layer 117, in accordance with some embodiments. The hard mask layer 120 is used in assisting patterning of gate structures 108. In some embodiments, the thickness $H_1$ of hard mask layer 120 is in a range from about 70 nm to about 100 nm. The thickness $H_2$ of gate electrode layer 117 is in a range from about 80 nm to about 100 nm. The thickness $H_3$ of gate dielectric layer 115 is in a range from about 2 nm to about 5 nm. The channel length L is shown in FIG. 2A as equal to the width of gate electrode layer 117 of a gate structure 108. Channel regions 112, which are directly under the gate structures 108 are also noted in FIG. 2A. A dotted line 118 indicates the level of surfaces of isolation regions 106.

FIG. 2A also show spacers 111 formed next to the gate structures 108. Spacers 111 include an offset spacer layer 116 and a main spacer layer 125, in accordance with some embodiments. Between neighboring gate structures 108, there are recesses 127. The depth $H_R$ of recesses 127 below surface 118 of isolation structures 106 is in a range from about 10 nm to about 20 nm. The recesses 127 may be formed to have either an angular or rounded shape on the bottoms.

FIG. 2B shows a cross-sectional view of transistor region 150 according to the cut 132 illustrated in FIG. 1A, in accordance with some embodiments. FIG. 2B shows recesses 127 in two neighboring recessed fins 104 separated (or isolated) from each other by an isolation structure 106. Each of the two neighboring recessed fins 104 has isolation structures 106 on both sides. Each fin 104 has a portion protruding above surfaces 107 of neighboring isolation structures 106. The distance $W_1$ between the two neighboring recesses 127 is in a range from about 10 nm to about 20 nm, in some embodiments.

After the recesses 127 are formed, an epitaxial material is deposited in recesses 127 to form doped source and drain regions, $110_D'$ and $110_S'$ respectively, at operation 206 of FIG. 2, in accordance with some embodiments. Doped source and drain regions $110_D'$ and $110_S'$ are located right next to the LDD regions 113, which are between channel regions 112 and source/drain regions $110_D'$, $110_S'$. The dopants in the doped source and drain regions, $110_D'$, $110_S'$, could diffuse into and dope the LDD regions 113 by anneal. In order to dope the LDD regions 113, the dopant concentration of the doped source and drain regions $110_D'$ and $110_S'$ needs to be much higher than the required dopant concentration of the LDD regions 113. For example, if the dopant level (or concentration) of p-type dopant in the LDD regions 133 is at a value equal to or greater than about 1E20 atoms/cm$^3$, the dopant concentration of the doped source and drain regions should have a value equal to or greater than about 3E20 atoms/cm$^3$.

In some embodiments, the epitaxial material filling recesses 127 to form doped source and drain regions, $110_D'$ and $110_S'$, is a silicon-containing material 215. In some embodiments, the epitaxially-grown silicon-containing material 215 is formed by an epitaxial deposition/partial etch process, which repeats the epitaxial deposition/partial etch process at least once. Such repeated deposition/partial etch process is also called a cyclic deposition-etch (CDE) process.

The deposition of the silicon-containing material 215 includes in-situ doping the silicon-containing material 215, in accordance with some embodiments. For example, forming an n-channel transistor can use an n-type doping precursor, e.g., phosphine (PH3) and/or other n-type doping precursor. By using the in-situ doping process, the dopant concentration (or level) of the silicon-containing material 215 can be desirably controlled and achieved. In some embodiments, the silicon-containing material 215 can be an n-type doped silicon layer that is doped with phosphorus (Si:P). In some embodiments, the silicon-containing material 215 can be an n-type doped silicon layer that is doped with both phosphorus and carbon (Si:CP). Carbon could impede the out-diffusion of phosphorus from the silicon-containing material 215. In some embodiments, the carbon dopant has a concentration in a range from about 0.1% to about 5% (atomic percent). Other types of dopants may also be included, including various doping precursors and dopants for forming a p-channel transistor, as would be known to a person skilled in the art.

In some embodiments, the silicon-containing material 215 can be formed by chemical vapor deposition (CVD), e.g., low pressure CVD (LPCVD), atomic layer CVD (ALCVD), ultrahigh vacuum CVD (UHVCVD), reduced pressure CVD (RPCVD), any suitable CVD; molecular beam epitaxy (MBE) processes; any suitable epitaxial process; or any combinations thereof.

The silicon-containing material 215 in recesses 127 is epitaxial. The deposition process forms a thin epitaxial layer of silicon-containing material in recesses 127 and an amorphous silicon-containing material on non-crystalline surfaces. An etching (or partial etching) process removes the amorphous silicon-containing material and also a portion of the silicon-containing material in recesses 127. The remaining silicon-containing material 215 is formed in each of the recesses 127.

In some embodiments, the etching process can use an etching gas including at least one of hydrogen chloride (HCl), chlorine (Cl$_2$), other suitable etching gases, and/or any combinations thereof. The etching process would remove the amorphous silicon-containing material over non-crystalline surface at a rate higher than the removal rate of epitaxial silicon-containing material 215. Therefore, only epitaxial film remains on the substrate surface after a CDDE cycle. The epitaxial deposition/partial etch process is repeated a number of times until a desired thickness is reached. As a result, such repeated deposition/partial etch process is called a cyclic deposition-etch (CDE) process.

FIGS. 3A and 3B show cross-sectional views of doped drain regions 110$_D$' formed by CDE process described above, in accordance with some embodiments. The growth rate of epitaxial Si depends on the crystal orientation. Growth rate is slower on closed-packed {111} planes. The doped drain regions 110$_D$' are made of doped silicon-containing material 215, which also form doped source regions 110$_S$' (not shown in FIGS. 3A and 3B). In some embodiments, the total thickness H$_T$ of epitaxial silicon-containing material 215 is in a range from about 40 nm to about 50 nm. The height (or thickness) H$_4$ of doped drain regions 110$_D$' above surface 216 between channel regions 112 and gate dielectric layer 115 is in a range from about 2 nm to about 10 nm, in some embodiments. The height (or thickness) H$_{SD}$ of doped drain regions 110$_D$' above surface 118 is in a range from about 35 nm to about 45 nm, in some embodiments. The shortest distance W$_1$ between two neighboring doped drain regions 110$_D$' is in a range from about 5 nm to about 20 nm, in accordance with some embodiments. Doped source regions 110$_S$' resemble the doped drain regions 110$_D$'. The description above for doped drain regions 110$_D$' also applies for doped source regions 110$_S$'.

Doped silicon-containing material 215 is commonly silicon germanium (SiGe). These SiGe structures can have some disadvantages. For example, in order for a S/D terminal to be connected to other parts of an integrated circuit, contacts are formed between the S/D terminal and a metal interconnect disposed on an overlying layer. Silicon germanium structures can exhibit a high contact resistance that results from forming a contact to the structure. Further, in order to impart a greater compressive strain on the channel of the transistor, the amount of germanium in the silicon germanium structures may be increased. However, higher Ge content tends to form a facet profile in the finFET structure thereby suppressing the desired higher Ge volume.

Figure 4:
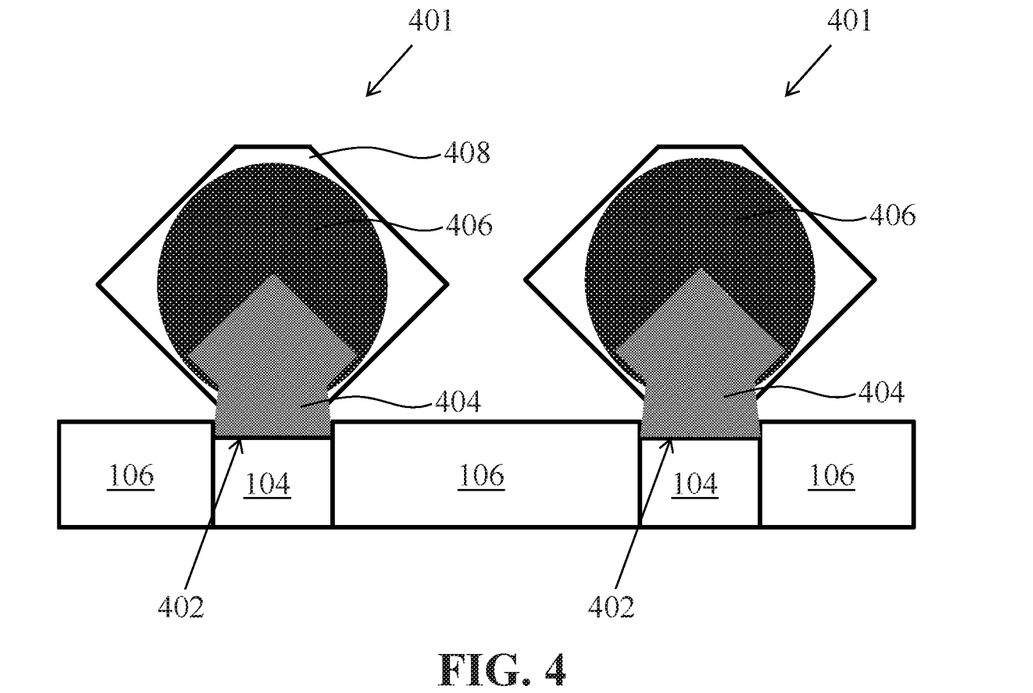
FIG. 4 is a cross-sectional view of source/drain regions of an example semiconductor device structure, according to an embodiment.

Referring to FIG. 4, a configuration of S/D structures 401 using SiGe and Germanium (Ge) growth is illustrated, according to an embodiment. FIG. 4 is a cross-sectional view of a pair of fins taken across S/D structures 401, and looking in toward a transistor channel region (e.g., the fin of the finFET would extend into, or out of, the page). The illustrated S/D structures 401 are formed over recessed fins 104 and between isolation structures 106. Interface 402 provides a single crystal surface from which SiGe kernels 404 are epitaxially grown, according to an embodiment. In one embodiment, interface 402 is below a top surface of isolation structures 106, as illustrated. In another embodiment, interface 402 is above a top surface of isolation structures 106. SiGe kernels 404 have sloped planar facets due to the epitaxial growth process resulting in the material forming more efficiently along its crystal planes. The cross-sectional shapes for each epitaxially grown material in S/D structures 401 is not intended to be limiting. In an embodiment, S/D structures 401 replace silicon-containing material 215 illustrated in the earlier process flow.

According to an embodiment, rounded Ge structures 406 are disposed on SiGe kernels 404. Rounded Ge structures 406 are typically, but not required to be, disposed on SiGe kernels 404 by a cyclic/deposition etch process. The repeated cycles of deposition and etching of the Ge results in a more rounded profile as illustrated. Note that the profile does not need to be a perfect circle, and in practice, the exact cross-sectional profile will vary. Capping structures 408 are disposed on rounded Ge structures 406. Capping structures 408 may include Si or SiGe. According to an embodiment, capping structures 408 include a low concentration of Ge compared to Si. Capping structures 408 may be included to protect the underlying SiGe from being affected by further fabrication process steps. Capping structures 408 may also protect the underlying SiGe from environmental effects such as oxidation and humidity. Capping structures 408 may also be used to form better ohmic contacts with a metal used to make electrical contact with S/D structures 401.

This illustrative configuration of S/D structures 401 advantageously provides lower contact resistance, and a greater volume of Ge than conventional structures, according to an embodiment. The greater volume of Ge may result in a greater compressive force applied to an adjacent transistor channel along the fin.

In an example, for the SiGe kernels 404, the germanium concentration is in a range from about 20% to about 50%. Ge structures 406 may be comprised of pure germanium, or include a high percentage of germanium compared to silicon. For example, Ge structures 406 include germanium in a range from about 50% to about 100% with any remaining percentage being silicon. Capping structure 408 may include germanium in a range from about 0% to about 30%, with any remaining percentage being silicon.

Figure 5:
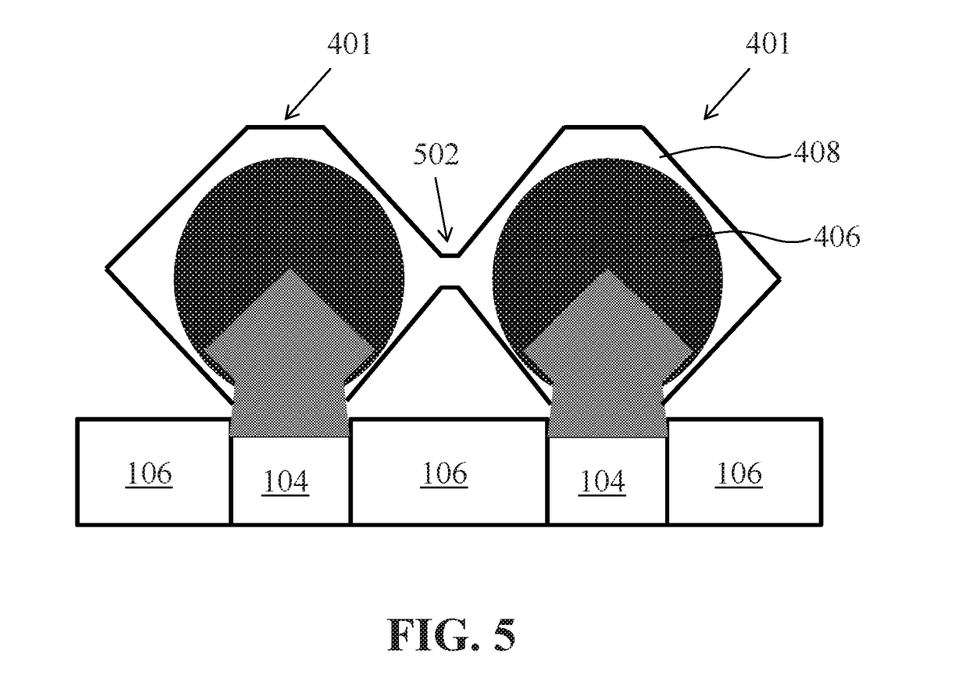
FIG. 5 is another cross-sectional view of source/drain regions of an example semiconductor device structure, according to an embodiment.

FIG. 5 illustrates another configuration of S/D structures 401, according to an embodiment. S/D structures 401 are located close enough together that the formation of capping layer 408 causes capping layer 408 to connect at region 502 between adjacent S/D structures 401, according to an embodiment. A thickness of region 502 may vary depending on how close S/D structures 401 are together and how far capping layer 408 extends away from Ge structures 406. In an embodiment, region 502 includes substantially flat surfaces connected together at angles in a range from about 15 degrees to about 75 degrees. In another embodiment, region 502 includes a curved or rounded surface. Any of the angles shown from the structures of either SiGe kernels 404 or capping layer 408 may be rounded, according to an embodiment.

Figure 6:
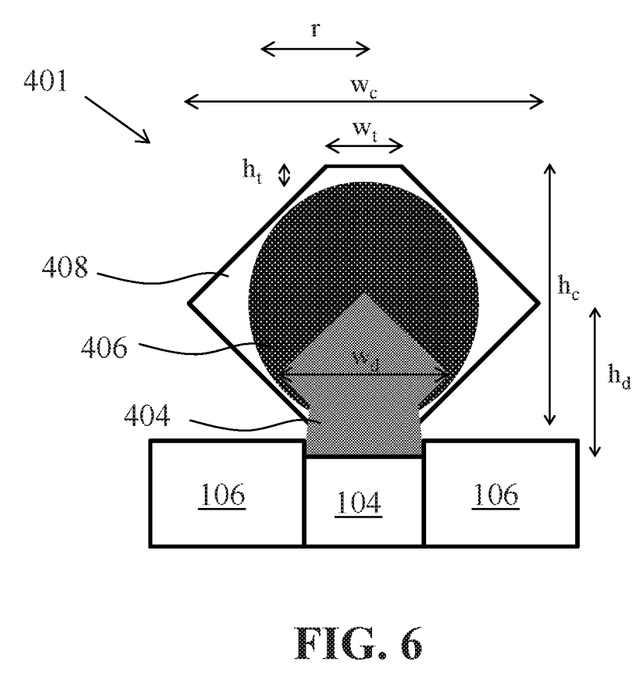
FIG. 6 is another cross-sectional view of source/drain regions of an example semiconductor device structure, according to an embodiment.

FIG. 6 illustrates an S/D structure 401 with dimensions of the various components of S/D structure 401 being identified. According to an embodiment, a height h$_d$ of SiGe kernel 404 is in a range from about 10 nm to about 25 nm. According to an embodiment, a width w$_d$ of SiGe kernel 404 is in a range from about 10 nm to about 20 nm. According to an embodiment, an approximate radius r of Ge structures 406 is in a range from about 10 nm to about 20 nm. According to another embodiment, the approximate radius r of Ge structures 406 is in a range from about 13 nm to about 15 nm. According to an embodiment, a height of capping structure 408 is in a range from about 40 nm to about 60 nm. According to an embodiment, a width w$_c$ of capping structure 408 is in a range from about 30 nm to about 45 nm. According to an embodiment, a width w$_t$ of a flat top surface of capping structure 408 is in a range from about 2 nm to about 10 nm. According to an embodiment, a height $h_t$ that capping structure 408 extends above Ge structure 406 is in a range from about 5 nm to about 20 nm. According to another embodiment, a height $h_t$ that capping structure 408 extends above Ge structure 406 is in a range from about 9 nm to about 11 nm. According to an embodiment, the angles of SiGe kernel 404 range from about 40 degrees to about 60 degrees. According to an embodiment, the angles of capping structure 408 range from about 40 degree to about 60 degrees.

Figure 7A:
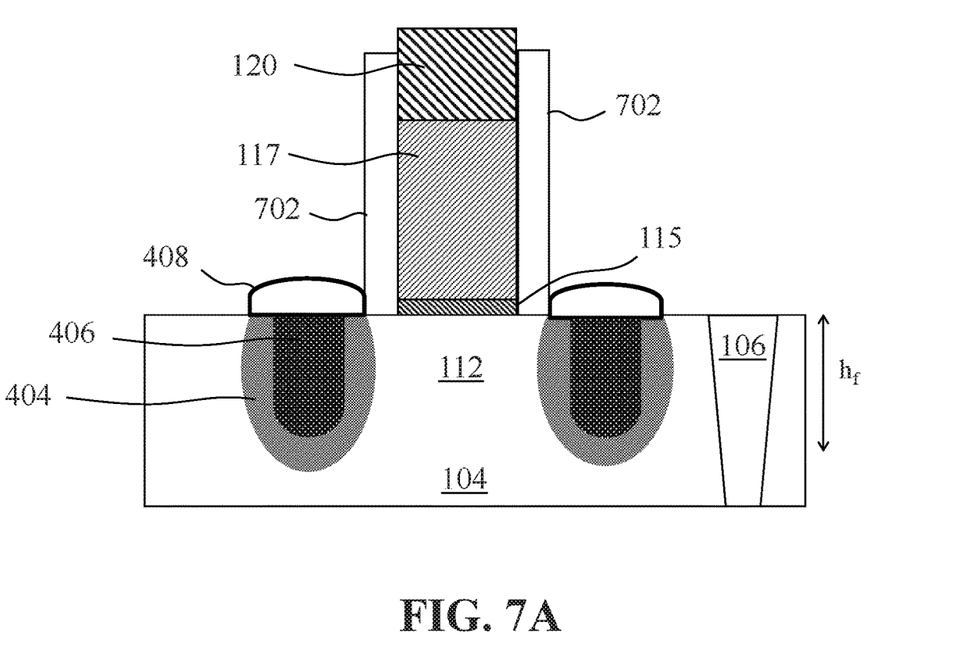
FIGS. 7A and 7B show cross-sectional views of an example transistor region after forming the doped source and drain regions, in accordance with some embodiments.
Figure 7B:
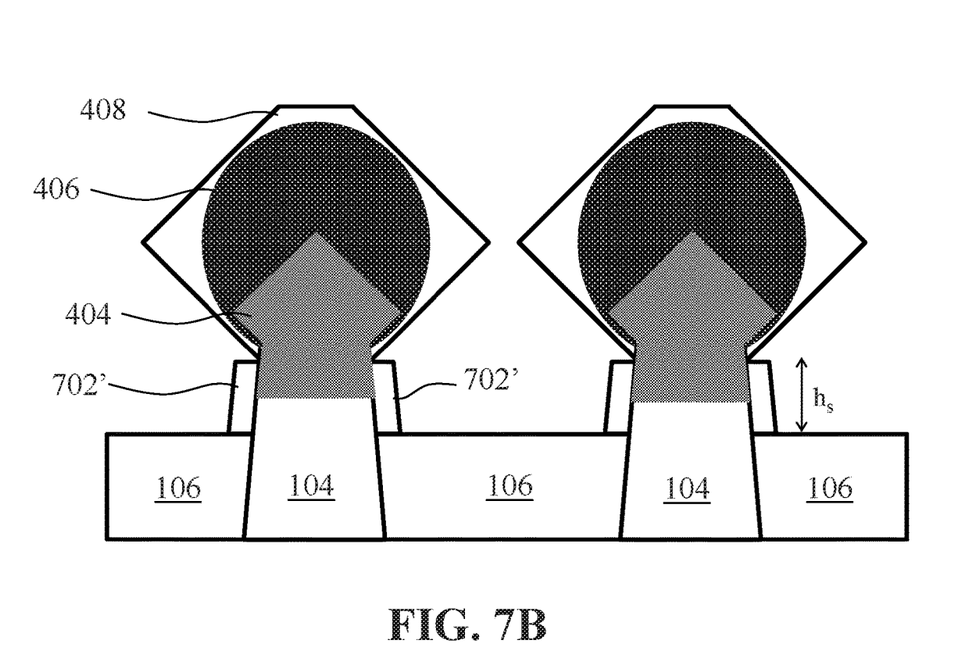

FIGS. 7A and 7B illustrate cross sections taken across cut 131 and cut 132 respectively, according to another embodiment. These cross-sections may be taken along the same cuts as those illustrated in FIGS. 3A and 3B. FIG. 7A illustrates a gate structure formed over channel region 112. The gate structure includes gate dielectric layer 115, gate electrode layer 117, hard mask layer 120, and sidewall spacers 702, according to an embodiment. Gate dielectric layer 115, gate electrode layer 117, and hard mask layer 120 have been described previously with reference to FIGS. 1 and 2A.

Sidewall spacers 702 include one or more layers of insulating material that are formed on the sidewalls of the gate structure. In an embodiment, sidewall spacers 702 include silicon nitride. Other materials that may be used for sidewall spacers 702 include silicon dioxide and high-k dielectrics. Sidewall spacers 702 may be formed using an etch-back technique where a blanket deposition of material is etched, leaving the material along the sidewalls of structures. According to an embodiment, sidewall spacers 702 protect channel region 112 (and its lightly doped area) during an etch process that forms the recesses to be filled with the S/D regions.

FIG. 7A also illustrates how the S/D regions flanking either side of channel region 112 include growth of SiGe kernels 404, followed by Ge structures 406, followed by the formation of capping structures 408. Isolation structure 106 is illustrated for separating neighboring finFET devices, according to an embodiment. Although isotropic etching has been used to form the S/D region recesses in FIG. 7A, anisotropic etching may also be used to form the recesses.

FIG. 7B illustrates a cross-section taken through one of the S/D regions of FIG. 7A, according to an embodiment. The illustration is similar to that shown in FIG. 4, except that the S/D region includes sidewall spacer portions 702'. These sidewall spacer portions 702' remain along a lower portion of the sidewalls of fin 104 above isolation structures 106 during the etch-back process that forms sidewall spacers 702, according to an embodiment. The etch-back process removes the insulating material along a top surface of fin 104, and along a majority of the sidewalls of fin 104, leaving behind only sidewall spacer portions 702' in the S/D regions. These sidewall spacer portions 702' guide the growth of SiGe kernels 404 and affect its growth profile, according to an embodiment. According to an embodiment, sidewall spacer portions 702' have a height $h_s$ in a range from about 5 nm to about 20 nm. According to another embodiment, a ratio between height $h_s$ of sidewall spacer portions 702' and a height of $h_f$ of channel region 112 is in a range from about 0.1% to about 0.4%.

Figure 8:
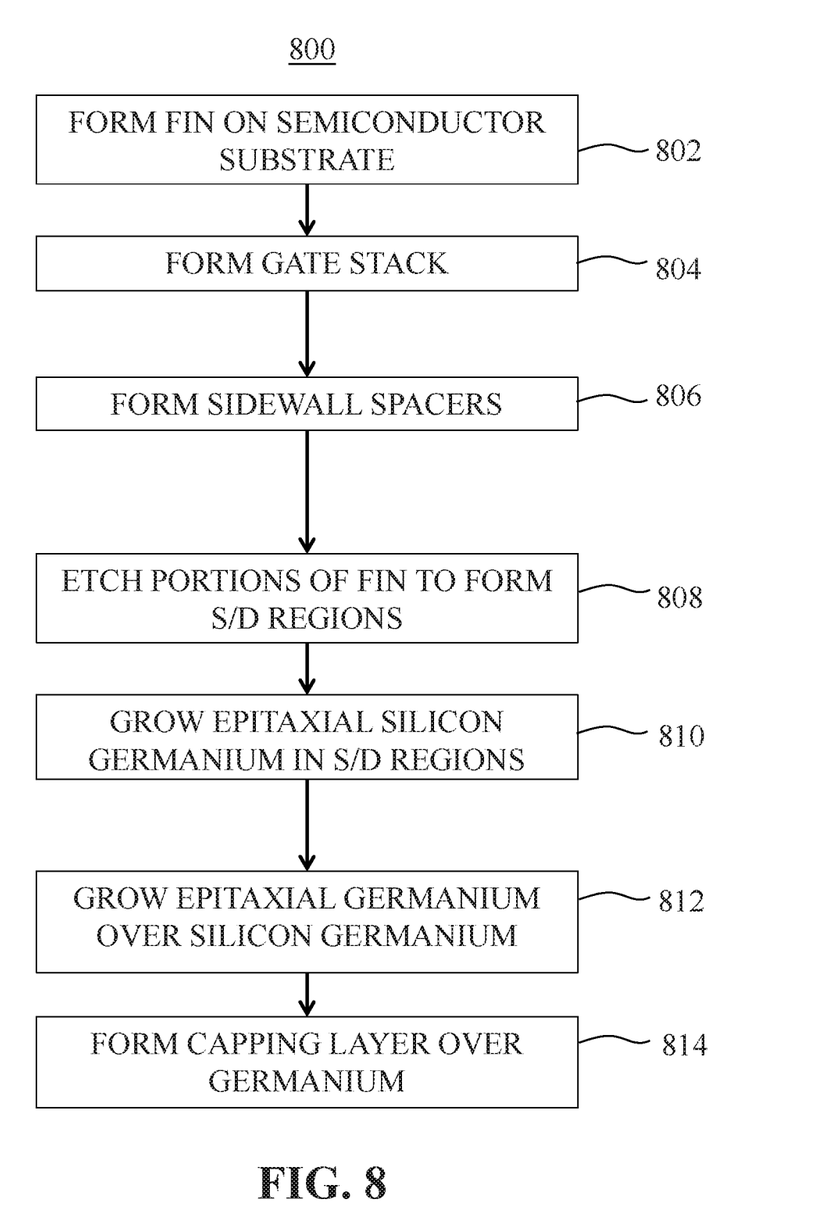
FIG. 8 is a flow diagram illustrating a method, according to an embodiment.

FIG. 8 is a flow diagram of an illustrative method 700, in accordance with an embodiment, of forming S/D structures having lower contact resistance and greater strain induced in an adjacent transistor channel as compared to conventional S/D structures. Other fabrication steps may be performed between the various steps of method 700, and are omitted merely for clarity.

Method 800 begins with a semiconductor substrate. For example, the semiconductor substrate is a bulk Si wafer. Alternative embodiments may use other semiconductor materials. Method 800 includes patterning 802 a semiconductor substrate to form a fin. The fin is vertical, i.e., it is nominally perpendicular to the surface of the substrate, and the fin may be rectangular or have portions that are sloped. The fin may be formed using a variety of dry etch techniques such as reactive ion etching or inductively coupled plasma etching.

Method 800 continues with forming 804 a gate stack on the fin, the gate stack having a first sidewall and a second sidewall. Forming the gate stack may include forming a gate dielectric on the fin, and then forming a gate electrode over the gate dielectric. Example gate dielectrics include silicon dioxide, silicon nitride, and high-k dielectric materials. The gate electrode may include a stack of various metal and metal alloy layers, or a layer of polysilicon.

Method 800 continues with forming 806 a first sidewall spacer adjacent to the first sidewall, and a second sidewall spacer adjacent to the second sidewall. The first and second sidewall spacers may be formed at the same time using an etch-back process.

In order to prepare the semiconductor substrate for the formation of S/D structures, portions of the fin adjacent to the sidewall spacers are removed. Thus, method 800 continues by etching 808 exposed portions of the fin. These exposed portions of the fin are those portions that are not covered by the gate stack or are not covered by the sidewall spacers. Because the gate stack and the sidewall spacers act as masking materials, they protect the fin underneath them from the process step of etching 808. This etching process may continue until the etched portions of the fin are recessed below the neighboring isolation material. This exposed recessed interface acts as a nucleation site for subsequent epitaxial growth of silicon-containing compounds, according to an embodiment.

Method 800 continues with growing 810 SiGe on the recessed interface to form a diamond-shaped structure over each recessed interface. The SiGe epitaxial growth may be a selective epitaxial growth at a temperature between about 500° C. and about 700° C., at a pressure between about 10 Torr and about 100 Torr, with HCl, $SiH_2Cl_2$ (dichlorosilane), $SiH_4$ (silane), $GeH_4$ (germane), $B_2H_6$ (diborane), and $H_2$ carrier gas. The germanium concentration may be between about 20% and about 50% in the epitaxially grown SiGe material.

Method 800 continues by epitaxially growing 812 Ge on each of the diamond-shaped SiGe structures to form a rounded structure. In some embodiments, the rounded Ge structures are formed by the cyclic/deposition etch (CDE) process. The CDE process typically includes alternating deposition and etch cycles within the same process chamber by alternating the mixture of gases flowing into the process chamber. For example, such a CDE process for forming the rounded Ge structure can have the following parameter values: temperature between about 300° C. and about 600° C., pressure between about 10 Torr and about 500 Torr, $SiH_2Cl_2$, $SiH_4$, $GeH_4$, $B_2H_6$, and $H_2$ carrier gas for the deposition; and a temperature between about 300° C. and about 600° C., pressure between about 10 Torr and about 500 Torr, HCl, $GeH_4$, and $H_2$ carrier gas for the etch.

Method 800 further includes forming 814 a capping layer on each of the rounded Ge structures. The capping layer may be formed by an epitaxial growth of Si or SiGe on the rounded Ge structures formed by the epitaxial Ge growth.

One benefit of p-channel finFET S/D structures in accordance with this disclosure is that, even though the volume of the S/D structures is greater than conventional p-channel finFET S/D structures, there are no layout design rule changes that are needed. That is, the layout design rules for a contact between a first metal metal layer and the p-channel finFET S/D structures in accordance with this disclosure are the same as the layout design rules for a contact between the first metal layer and n-channel finFET S/D structures.

In one embodiment, a semiconductor structure includes an epitaxial SiGe structure disposed adjacent a first end of a transistor channel region, the epitaxial SiGe structure having sloped facets, an epitaxial Ge structure disposed on the epitaxial SiGe structure, the epitaxial Ge structure having a rounded surface; and a capping layer disposed on the rounded surface of the epitaxial Ge structure. Together the epitaxial SiGe structure, the epitaxial Ge and the capping layer form a S/D structure designed to apply strain to the channel region of a finFET. And because the epitaxial Ge structure has a greater volume than that achieved with SiGe alone, there is also a larger landing area for contacts to the S/D and thus lower contact resistance than conventional device architectures.

In another embodiment, a method of forming structures for S/D regions of a p-channel finFET includes (a) forming a fin on a semiconductor substrate, (b) forming a gate stack on the fin, the gate stack having a first sidewall and a second sidewall, (c) forming a first sidewall spacer adjacent the first sidewall spacer, and a second sidewall spacer adjacent the second sidewall, (d) etching portions of the fin not covered by the gate stack or not covered by the sidewall spacers, (e) epitaxially growing SiGe on the etched portions of the fin to form a first portion of a first source/drain (S/D) structure, and a first portion of a second S/D structure; and (f) epitaxially growing Ge on the first portion of the first S/D structure to form a second portion of the first S/D structure, and epitaxially growing Ge on the first portion of the second S/D structure to form a second portion of the second S/D structure. In this illustrative embodiment, the first portion of the first S/D structure is an epitaxially grown SiGe structure that has flat sloped surfaces, and the second portion of the first S/D structure is an epitaxially grown Ge structure that has a rounded surface.

In a further embodiment, a method of applying compressive stress to a channel region of a p-channel finFET includes, (a) forming a gate stack on a fin, the gate stack having a first sidewall and a second sidewall, (b) forming a first sidewall spacer along the first sidewall and a second sidewall spacer along the second sidewall, (c) etching portions of the fin not covered by the gate stack or the sidewall spacers to provide source/drain (S/D) foundation structures, (d) epitaxially growing SiGe on the S/D foundation structures to form a diamond-shaped structure on each of the S/D foundation structures, (e) epitaxially growing Ge on each of the diamond-shaped structures to form a rounded structure; and (f) forming a capping layer on each of the rounded structures.

It is to be appreciated that the Detailed Description section, and not the Abstract section, is intended to be used to interpret the claims. The Abstract section may set forth one or more but not all exemplary embodiments of the present invention as contemplated by the inventor(s), and thus, is not intended to limit the present invention and the appended claims in any way.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A semiconductor structure, comprising:
   a fin extending above a top surface of an adjacent isolation structure;
   an epitaxial SiGe structure disposed adjacent to an end portion of the fin and in contact with the fin, wherein the epitaxial SiGe stricture has a diamond shape comprising a first sloped facet and a second sloped facet below the first sloped facet;
   an epitaxial Ge structure disposed on the epitaxial SiGe structure and in contact with the first and second sloped facets, the epitaxial Ge structure having a rounded surface not in contact with the first and second sloped facets, wherein the epitaxial Ge structure does not contact the adjacent isolation structure, and wherein the rounded surface is a convex shape with respect to an upper surface of the fin; and
   a capping layer disposed on the rounded surface of the epitaxial Ge structure.

2. The semiconductor structure of claim 1, further comprising:
   an other epitaxial SiGe structure disposed adjacent to an other end portion of an other fin, the other epitaxial SiGe structure having one or more sloped facets;
   an other epitaxial Ge structure disposed on the other epitaxial SiGe structure, the other epitaxial Ge structure having a rounded surface; and
   an other capping layer disposed on the rounded surface of the other epitaxial Ge structure.

3. The semiconductor structure of claim 1, wherein the capping layer comprises silica.

4. The semiconductor structure of claim 1, further comprising one or more insulating sidewalls adjacent to the epitaxial SiGe structure, wherein the one or more insulating sidewalls affect a growth profile of the epitaxial SiGe structure.

5. The semiconductor structure of claim 1, wherein the epitaxial Ge structure comprises between 50% and 100% Ge, and wherein the epitaxial Ge structure comprises a higher percentage of germanium than that of silicon.

6. The semiconductor structure of claim 1, wherein the epitaxial SiGe structure comprises between 20% and 50% Ge.

7. A semiconductor structure, comprising:
   an isolation structure;
   an epitaxial SiGe structure formed adjacent to a first side of the isolation structure and having a diamond shape comprising a first sloped facet and a second sloped facet below the first sloped facet;
   an epitaxial Ge structure disposed on the epitaxial SiGe structure and enclosing the first and second sloped facets, the epitaxial Ge structure having a rounded surface not in contact with the first and second sloped facets, wherein the epitaxial Ge structure does not contact the isolation structure and the rounded surface is a convex shape with respect to an upper surface of a fin;

a capping layer disposed on the rounded surface of the epitaxial Ge structure;

an other epitaxial SiGe structure formed adjacent to a second side of the isolation structure, wherein the other epitaxial SiGe structure is separate from the epitaxial SiGe structure and has a diamond shape comprising a third sloped facet and a fourth sloped facet below the third sloped facet;

an other epitaxial Ge structure disposed on the other epitaxial SiGe structure and enclosing the third and fourth sloped facets, the other epitaxial Ge structure having a rounded surface not in contact with the third and fourth sloped facets and being separate from the epitaxial Ge structure; and an other capping layer disposed on the rounded surface of the other epitaxial Ge structure.

8. The semiconductor structure of claim 7, wherein the semiconductor structure is disposed on a bulk silicon wafer.

9. The semiconductor structure of claim 7, wherein the capping layer comprises silicon.

10. The semiconductor structure of claim 7, further comprising one or more insulating sidewalls adjacent to the epitaxial SiGe structure, wherein the epitaxial SiGe structure is formed over the one or more insulating sidewalk.

11. The semiconductor structure of claim 7, wherein the epitaxial Ge structure comprises between 50% and 100% Ge, and wherein the epitaxial Ge structure comprises a higher percentage of germanium than that of silicon.

12. The semiconductor structure of claim 7, wherein the epitaxial SiGe structure comprises between 20% and 50% Ge.

13. A semiconductor structure, comprising:

a fin extending above a top surface of an isolation structure;

an epitaxial SiGe structure disposed adjacent to an end portion of the fin, the epitaxial SiGe structure having a diamond shape comprising three or more sloped facets;

an epitaxial Ge structure disposed on the epitaxial SiGe structure, the epitaxial Ge structure having a rounded surface not in contact with the three or more sloped facets of the epitaxial SiGe structure, wherein the epitaxial Ge structure encloses the three: or more sloped facets of the epitaxial SiGe structure and does not contact the isolation structure, and wherein the rounded surface is a convex shape with respect to an upper surface of the fin;

an other epitaxial SiGe structure disposed adjacent to an other end portion of an other fin, the other epitaxial SiGe structure having a diamond shape comprising three or more sloped facets and being separate from the epitaxial SiGe structure;

an other epitaxial Ge structure disposed on the other epitaxial SiGe structure and enclosing the three: or more sloped facets of the other epitaxial SiGe structure, the other epitaxial Ge structure having a rounded surface not in contact with the three or more sloped facets of the other epitaxial SiGe structure and being separate from the epitaxial Ge structure; and a capping layer disposed on the rounded surface of the epitaxial Ge structure and the other epitaxial Ge structure and connected between the epitaxial Ge structure and the other epitaxial Ge structure.

14. The semiconductor structure of claim 13, wherein the capping layer comprises silicon.

15. The semiconductor structure of claim 13, further comprising one or more insulating sidewalls adjacent to the epitaxial SiGe structure, wherein the epitaxial SiGe structure is formed over the one or more insulating sidewalls.

16. The semiconductor structure of claim 13, wherein the epitaxial Ge structure comprises between 50% and 100% Ge, and wherein the epitaxial Ge structure comprises a higher percentage of germanium than that of silicon.

17. The semiconductor structure of claim 13, wherein the epitaxial SiGe structure comprises between 20% and 50% Ge.

18. The semiconductor structure of claim 1, wherein the capping layer is in contact with the epitaxial SiGe structure and the epitaxial Ge structure.

19. The semiconductor structure of claim 13, wherein the epitaxial SiGe structure comprises four sloped facets and the epitaxial Ge structure encloses each of the four sloped facets of the epitaxial SiGe structure.

20. The semiconductor structure of claim 13, wherein the capping layer is in contact with the epitaxial SiGe structure and the epitaxial Ge structure.

* * * * *